United States Patent
Liu et al.

(10) Patent No.: US 8,941,336 B1
(45) Date of Patent: Jan. 27, 2015

(54) OPTICAL CHARACTERIZATION SYSTEMS EMPLOYING COMPACT SYNCHROTRON RADIATION SOURCES

(71) Applicant: KLA-Tencor Corporation, Milpitas, CA (US)

(72) Inventors: Yanwei Liu, Danville, CA (US); Daniel C. Wack, Fredericksburg, VA (US)

(73) Assignee: KLA-Tencor Corporation, Milpitas, CA (US)

( * ) Notice: Subject to any disclaimer, the term of this patent is extended or adjusted under 35 U.S.C. 154(b) by 0 days.

(21) Appl. No.: 14/300,101

(22) Filed: Jun. 9, 2014

Related U.S. Application Data

(63) Continuation of application No. 13/964,880, filed on Aug. 12, 2013, now Pat. No. 8,749,179.

(60) Provisional application No. 61/682,772, filed on Aug. 14, 2012.

(51) Int. Cl.
*H01J 40/00* (2006.01)
*H01J 47/00* (2006.01)
*H05H 13/04* (2006.01)
*H05G 2/00* (2006.01)

(52) U.S. Cl.
CPC ............... *H05H 13/04* (2013.01); *H05G 2/001* (2013.01)
USPC .................... 315/503; 250/504 R; 250/493.1; 250/492.2; 250/492.1; 250/372

(58) Field of Classification Search
USPC ............ 250/305, 504 R, 493.1, 492.2, 492.1, 250/372; 315/503
See application file for complete search history.

(56) References Cited

U.S. PATENT DOCUMENTS

| | | | |
|---|---|---|---|
| 5,341,104 A | 8/1994 | Anton et al. | |
| 6,198,793 B1 | 3/2001 | Schultz et al. | |
| 6,456,362 B1 * | 9/2002 | Banine | 355/67 |
| 6,498,351 B1 | 12/2002 | Kruizinga et al. | |
| 6,570,168 B1 * | 5/2003 | Schultz et al. | 250/492.2 |
| 7,329,886 B2 * | 2/2008 | Singer et al. | 250/493.1 |

FOREIGN PATENT DOCUMENTS

EP    1065568 A2    1/2001

\* cited by examiner

*Primary Examiner* — Jack Berman
*Assistant Examiner* — Meenakshi Sahu
(74) *Attorney, Agent, or Firm* — Suiter Swantz pc llo

(57) ABSTRACT

A compact synchrotron radiation source includes an electron beam generator, an electron storage ring, one or more wiggler insertion devices disposed along one or more straight sections of the electron storage ring, the one or more wiggler insertion devices including a set of magnetic poles configured to generate a periodic alternating magnetic field suitable for producing synchrotron radiation emitted along the direction of travel of the electrons of the storage ring, wherein the one or more wiggler insertion devices are arranged to provide light to a set of illumination optics of a wafer optical characterization system or a mask optical characterization system, wherein the etendue of a light beam emitted by the one or more wiggler insertion devices is matched to the illumination optics of the at least one of a wafer optical characterization system and the mask optical characterization system.

10 Claims, 10 Drawing Sheets

001
OPTICAL CHARACTERIZATION SYSTEMS EMPLOYING COMPACT SYNCHROTRON RADIATION SOURCES

CROSS-REFERENCE TO RELATED APPLICATION

The present application is related to and claims the benefit of the earliest available effective filing date(s) from the following listed application(s) (the "Related Applications") (e.g., claims earliest available priority dates for other than provisional patent applications or claims benefits under 35 USC §119(e) for provisional patent applications, for any and all parent, grandparent, great-grandparent, etc. applications of the Related Application(s)).

RELATED APPLICATIONS

For purposes of the USPTO extra-statutory requirements, the present application constitutes a continuation patent application of United States Patent Application entitled OPTICAL CHARACTERIZATION SYSTEMS EMPLOYING COMPACT SYNCHROTRON RADIATION SOURCES, naming Yanwei Liu and Daniel C. Wack as inventors, filed Aug. 12, 2013, application Ser. No. 13/964,880, which constitutes a regular (non-provisional) patent application of United States Provisional Patent Application entitled High Throughput and Availability Wafer and EUV Mask Inspection Systems Employing Low-Cost Wiggler Sources, naming Yanwei Liu and Daniel C. Wack as inventors, filed Aug. 14, 2012, Application Ser. No. 61/682,772.

TECHNICAL FIELD

The present invention generally relates to wafer and mask optical characterization, and more particularly to a semiconductor wafer inspection system, an actinic EUV mask inspection system or an actinic mask review system equipped with a wiggler based synchrotron radiation source.

BACKGROUND

Plasma based light sources are commonly implemented to generate extreme ultraviolet (EUV) and vacuum ultraviolet (VUV) light in wafer and mask inspection systems. For instance, discharged-produced plasma (DPP) and laser-produced plasma (LPP) are conventional components in EUV illumination source technologies.

DPP and LPP based light sources possess a number of disadvantages. For example, in order to achieve higher levels of in-band EUV brightness, time-multiplexing of several sources is required, particularly in technologies implementing DPP sources. The time-multiplexing of several sources limits inspection throughput, while simultaneously increasing cost and complexity.

In addition, spectral output in DPP and LPP sources cannot be directly controlled in design or operation. In the case of actinic EUV mask inspection, target materials are typically selected based on the existence of transition radiation within the 2% bandwidth defined by achievable multilayer coating designs, and plasma temperatures are optimized for overall conversion efficiency. Further, a low cost LPP source suitable for actinic EUV mask inspection can have different spectral properties from a scanner high-power LPP source, thereby increasing the difficulty of relating inspection image information to defect printability. In the case of broadband wafer inspection systems, such as VUV systems operating with light in the VUV (100-200 nm) region, a broad spectral emission combined with selectable bandpass filtering is typically required. It is noted that few target materials display broad VUV emission, forcing consideration of multiple target materials, often with vastly different physical properties.

In addition, pulse repetition rate in LPP and DPP systems is limited by a number of physical constraints, with pulse-pulse energy fluctuations being significant. Accordingly, system energy/dose monitoring and image normalization must achieve higher levels of performance in LPP and DPP systems, as compared to continuous wave (CW) or quasi-CW sources commonly implemented in deep UV mask inspection systems. Due to the inherent variability of drive energy transport or timing, and target material conditions, pulsed plasma sources have undesirable pulse-pulse variations of emission energy and spatial distribution. Since source repetition rates are typically below 50 KHz, and as low as 2 KHz, while integration times of inspection systems range from 1-10 ms, inspection system design must accommodate large variability in the number of pulses, and usually must incorporate a homogenizer function within the illumination optics to mitigate fluctuations of the in-band emission spatial distribution.

Further, surfaces and materials in close proximity to the plasma of a LPP or DPP source are typically exposed to high energy neutral and ion flux, which sputters and spalls the material. As such, debris and contamination mitigation is typically required to protect the associated downstream optics and mask. Given the ultraclean environment requirement for EUV mask inspection/metrology, this can be both expensive and difficult to implement. The debris is especially problematic for DPP sources as the particle production rate for a typical DPP source is on the order of cubic centimeters per week.

As such, it is desirable to provide an illumination source and corresponding mask and/or wafer characterization system (e.g., actinic EUV mask inspection system, wafer inspection system, EUV mask metrology system and the like) that overcomes the deficiencies identified in the prior art, enabling a clear path to ever-increasing demands on next generation systems.

SUMMARY

A synchrotron radiation source for generating light for a semiconductor wafer optical characterization system or a mask optical characterization system is disclosed. In a first aspect, the synchrotron radiation source may include, but is not limited to, an electron beam generator configured to generate one or more beams of electrons; an electron storage ring including a plurality of magnets configured to bend a trajectory of the electrons to trace a closed path; and one or more wiggler insertion devices disposed along at least one straight section of the electron storage ring, the one or more wiggler insertion devices including a plurality of magnetic poles configured to generate a periodic alternating magnetic field suitable for producing synchrotron radiation emitted substantially along the direction of travel of the electrons by accelerating the electrons periodically in a direction perpendicular to the direction of travel, wherein the one or more wiggler insertion devices are configured to provide light to a set of illumination optics of at least one of a wafer optical characterization system and a mask optical characterization system, wherein the etendue of a light beam emitted by the one or more wiggler insertion devices is matched to the illumination optics of the at least one of a wafer optical characterization system and the mask optical characterization system.

An actinic EUV mask inspection system is disclosed. In a first aspect, the actinic EUV mask inspection system may include, but is not limited to, a wiggler synchrotron source including: an electron beam generator configured to generate one or more beams of electrons; an electron storage ring including a plurality of magnets configured to bend a trajectory of the electrons to trace a closed path; one or more wiggler insertion devices disposed along at least one straight section of the electron storage ring, the one or more wiggler insertion devices including a plurality of magnetic poles configured to generate a periodic alternating magnetic field suitable for producing synchrotron radiation emitted substantially along the direction of travel of the electrons by accelerating the electrons periodically in a direction perpendicular to the direction of travel; an actinic EUV mask inspection optical sub-system including at least a set of illumination optics and a set of objective optics, wherein the etendue of a light beam emitted by the one or more wiggler insertion devices is matched to the set of illumination optics of the actinic EUV mask inspection optical sub-system; a set of beam delivery optics configured to deliver a selected wavelength band of light emitted by the one or more wiggler insertion devices of the wiggler synchrotron source to the set of illumination optics, wherein the set of illumination optics is configured to direct light from the beam delivery optics to a mask disposed on a mask stage, wherein the set of objective optics is configured to receive light reflected or scattered by the mask; and a sensor configured to receive a projected image of the mask from the set of objective optics.

A wafer inspection system is disclosed. In a first aspect, the wafer inspection system may include, but is not limited to, a wiggler synchrotron source including: an electron beam generator configured to generate one or more beams of electrons; an electron storage ring including a plurality of magnets configured to bend a trajectory of the electrons to trace a closed path; one or more wiggler insertion devices disposed along at least one straight section of the electron storage ring, the one or more wiggler insertion devices including a plurality of magnetic poles configured to generate a periodic alternating magnetic field suitable for producing synchrotron radiation emitted substantially along the direction of travel of the electrons by accelerating the electrons periodically in a direction perpendicular to the direction of travel; a wafer inspection optical sub-system including at least a set of illumination optics and a set of objective optics, wherein the etendue of a light beam emitted by the one or more wiggler insertion devices is matched to the set of illumination optics of the wafer inspection optical sub-system; a set of beam delivery optics configured to deliver broadband light emitted by the one or more wiggler insertion devices of the wiggler synchrotron source to the set of illumination optics, wherein the set of illumination optics is configured to direct light from the beam delivery optics to a wafer disposed on a wafer stage, wherein the set of objective optics is configured to receive light reflected or scattered by the wafer; and a sensor configured to receive a projected image of the wafer from the set of objective optics.

A EUV mask reflectometer system is disclosed. In a first aspect, the EUV mask reflectometer system may include, but is not limited to, a wiggler synchrotron source including: an electron beam generator configured to generate one or more beams of electrons; an electron storage ring including a plurality of magnets configured to bend a trajectory of the electrons to trace a closed path; one or more wiggler insertion devices disposed along at least one straight section of the electron storage ring, the one or more wiggler insertion devices including a plurality of magnetic poles configured to generate a periodic alternating magnetic field suitable for producing synchrotron radiation emitted substantially along the direction of travel of the electrons by accelerating the electrons periodically in a direction perpendicular to the direction of travel; a mask reflectometer optical sub-system including at least a set of illumination optics and a set of objective optics, wherein the etendue of a light beam emitted by the one or more wiggler insertion devices is matched to the set of illumination optics of the mask reflectometer optical sub-system; a set of beam delivery optics configured to deliver a selected wavelength band of light emitted by the one or more wiggle insertion devices of the wiggler synchrotron source to the set of illumination optics, wherein the set of illumination optics is configured to direct light from the beam delivery optics to a mask disposed on a mask stage, wherein the set of objective optics is configured to receive light reflected or scattered by the mask; and a sensor configured to receive light collected by the objective optics reflected or scattered from the mask.

A multiple sub-system mask inspection system is disclosed. In a first aspect, the multiple sub-system mask inspection system may include, but is not limited to, a wiggler synchrotron source including: an electron beam generator configured to generate one or more beams of electrons; an electron storage ring including a plurality of magnets configured to bend a trajectory of the electrons to trace a closed path; a first wiggler insertion device disposed along a first straight section of the electron storage ring; a second wiggler insertion device disposed along a second straight section of the electron storage ring, wherein the first wiggler insertion device and the second wiggler insertion device each include a plurality of magnetic poles configured to generate a periodic alternating magnetic field suitable for producing synchrotron radiation emitted substantially along the direction of travel of the electrons by accelerating the electrons periodically in a direction perpendicular to the direction of travel; a first optical characterization sub-system including at least a first set of illumination optics, wherein the etendue of a light beam emitted by the first wiggler insertion device is matched to the set of illumination optics of the first optical characterization sub-system; a second optical characterization sub-system including at least a second set of illumination optics, wherein the etendue of a light beam emitted by the second wiggler insertion device is matched to the set of illumination optics of the second optical characterization sub-system; a first set of beam delivery optics configured to deliver a selected wavelength band of light emitted by the first wiggler insertion device of the wiggler synchrotron source to the first set of illumination optics; and a second set of beam delivery optics configured to deliver a selected wavelength band of light emitted by the second wiggler insertion device of the wiggler synchrotron source to the second set of illumination optics.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF THE DRAWINGS

The numerous advantages of the disclosure may be better understood by those skilled in the art by reference to the accompanying figures in which.

DETAILED DESCRIPTION OF THE INVENTION

Figure 1A:
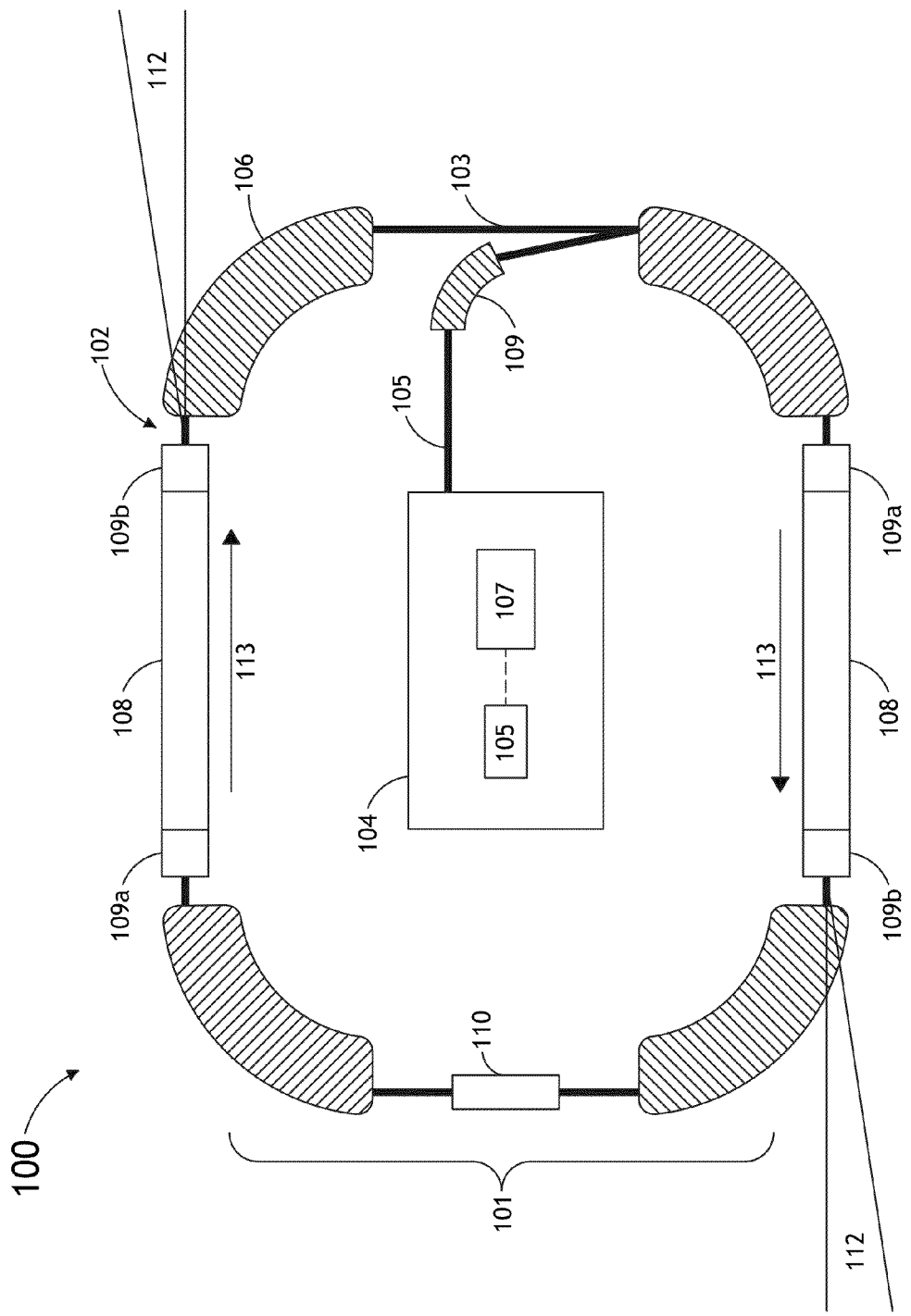
FIG. 1A is a simplified schematic view of a synchrotron radiation source with a wiggler insertion device, in accordance with one embodiment of the present invention.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention. Reference will now be made in detail to the subject matter disclosed, which is illustrated in the accompanying drawings.

Referring generally to FIG. 1A through 5, a wiggler based synchrotron radiation source 100 suitable for serving as an illumination source of a semiconductor wafer optical characterization system or a mask optical characterization system is described in accordance with the present invention.

Synchrotron radiation results from the acceleration of highly relativistic electrons, such as acceleration of electrons in a magnet field. It has generally shown impractical to use synchrotron sources in EUV-based semiconductor manufacturing processes due to size and power limitations within the spectral bandpass for EUV lithography (e.g., approximately 1-2% at $\lambda=13.5$ nm). Applicants note, however, the unique requirements of broadband semiconductor wafer inspection and narrowband actinic EUV mask inspection (as well as mask metrology (e.g., actinic mask review or EUV reflectometry)) provide a good match between an optimized synchrotron radiation source and an inspection/metrology system.

The present invention is directed towards a compact synchrotron radiation source equipped with one or more wiggler-type insertion devices suitable for delivering light (e.g., narrowband or broadband light) to the optical input (e.g., illumination optics) of a wafer inspection system, an actinic EUV mask inspection (AMI) system, an actinic mask review (AMR) system, a mask reflectometer system and the like. In addition, the present invention acts to balance spatial and angular distributions of the electron beam of the synchrotron radiation source to optimize, or at least improve, optical coupling between a wiggler based synchrotron radiation source and the optical sub-system of a given optical characterization system. In this regard, the present invention provides 'etendue matching' between the synchrotron radiation source and the optical input of the inspection/metrology system to maximize source utilization and reduce the technical requirements on the synchrotron itself. As such, the etendue of light emitted by a wiggler based synchrotron radiation source may be matched, within an acceptable tolerance level, to the optical input of at least one of a wafer optical characterization system or a mask optical characterization system of the present invention.

The present invention provides a broadband, selectable, and scalable emission distribution, whereby narrowband illumination is selected for actinic EUV mask inspection (or EUV metrology), with broadband illumination utilized in broadband wafer inspection. Wavelength bands can be selected through various filtering elements (e.g., spectral filters, diffraction gratings and the like) disposed between a photon beam output of the wiggler synchrotron source and the optical input, such as the input of the illumination optics, of a given optical characterization system.

Further, the present invention is directed to the implementation of multiple optical characterization systems optically coupled to a single compact wiggler based synchrotron source. For the purposes of the present disclosure an optical characterization system should be interpreted as any optical characterization or measurement system suitable for inspecting, review, characterizing or measuring one or more features of a semiconductor wafer or a lithography mask. For instance, an optical characterization system may include an actinic EUV mask inspection system, a wafer inspection system, or a EUV metrology system, such as, but not limited to, an actinic mask review system or EUV mask reflectometer.

Figure 1B:
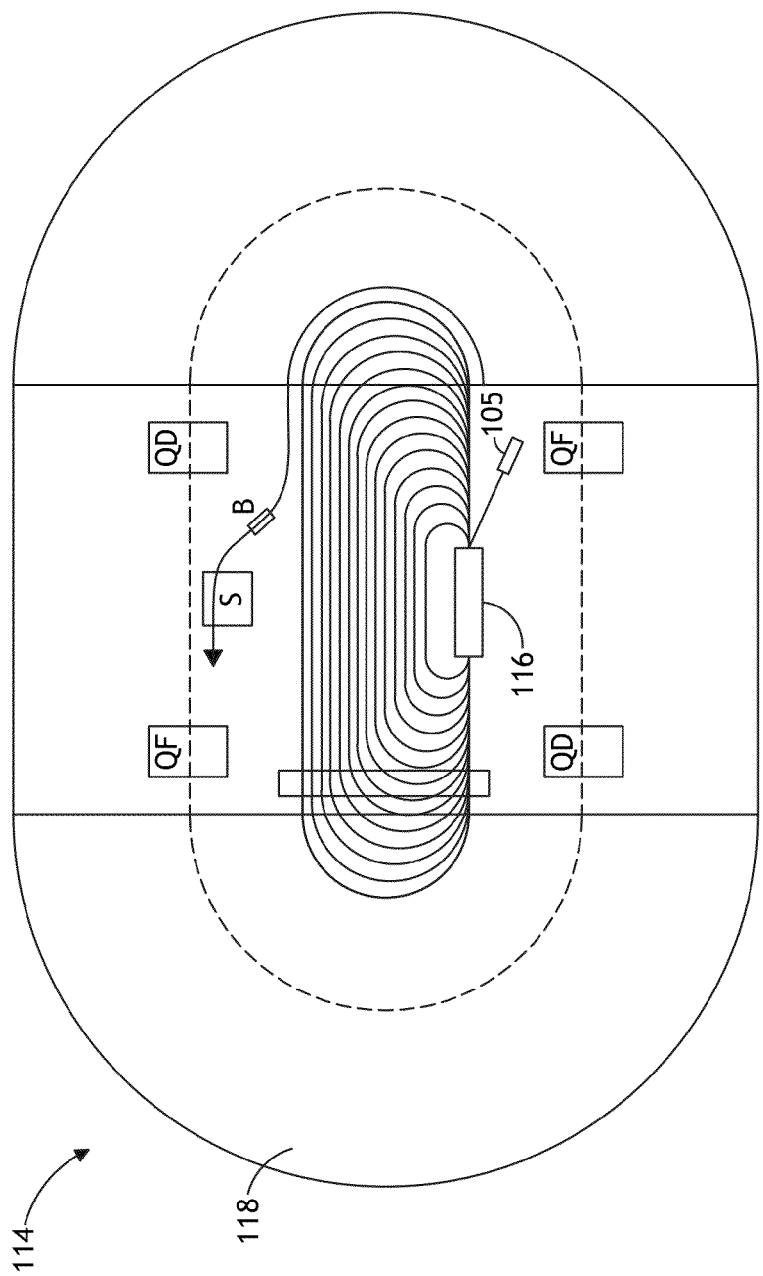
FIG. 1B is a simplified schematic view of a racetrack storage ring combined with a racetrack microtron device, in accordance with one embodiment of the present invention.

FIG. 1A illustrates the wiggler equipped synchrotron radiation source 100, in accordance with one embodiment of the present invention. In one embodiment, the radiation source 100 of the present invention may include an electron beam generator 104 suitable for generating one or more beams of electrons 105. In another embodiment, the electron beam generator 104 may include an electron gun 105 configured to generate electrons. In another embodiment, the electron beam generator 104 may include an electron accelerator device 107. In a further embodiment, the electron gun 105 is operably coupled to the electron accelerator device 107 such that electrons generated by the electron gun are injected into the accelerator device 107 for acceleration. In another embodiment, the electron accelerator device 107 may include, but is not limited to, a linac device (i.e., linear electron accelerator). In another embodiment, the electron accelerator device 107 may include, but is not limited to, a compact microtron device. As shown in FIG. 1B, a compact microtron device 114 may accelerate electrons utilizing a modified linear accelerator 116 in a racetrack geometry, enabled via the pair of D-shaped magnets 118 (e.g., D-shaped electromagnets). In this regard, the electron gun 105 may emit electrons into the microtron device 114. Then, the electrons are accelerated via the linear accelerator 116 with each pass through the "racetrack" pathway of the microtron device 114. In another embodiment, the microtron device plane may be horizontal or vertical. In a further embodiment, the microtron device plane may be arranged such that it is co-planar with the storage ring 101.

Referring again to FIG. 1A, the radiation source 100 of the present invention may include a compact electron storage ring 101, in accordance with one embodiment of the present invention. In another embodiment, the electron storage ring 101 of the radiation source 100 may include, but is not limited to, a plurality of magnets configured to bend the trajectory of the electrons emitted from the electron beam generator 104 into a closed path about the storage ring 101. For example, as shown in FIG. 1A, once the electrons 105 are injected into the storage ring they may circulate about the closed path 103 about the storage ring 101. In one embodiment, the bending magnets 106 may include, but are not limited to, one or more permanent magnets. In another embodiment, the bending magnets 106 may include, but are not limited to, one or more electromagnets. In another embodiment, the bending magnets 106 may include, but are not limited to, one or more superconducting magnets.

In another embodiment, the electron storage ring 101 plane may be arranged horizontally or vertically. In a further embodiment, the microtron device plane may be arranged such that it is co-planar with the storage ring 101.

In another embodiment, the synchrotron radiation source 100 includes an RF system 110 configured to supply energy to the electrons as they circulate about the electron storage ring 101. The RF system 110 may include any RF system known in the art.

In another embodiment, the radiation source 100 includes one or more wiggler insertion devices 108. In one embodiment, each wiggler insertion device 108 of the radiation source 100 is disposed along a straight section of the electron storage ring 101, as depicted in FIG. 1A.

Figure 2:
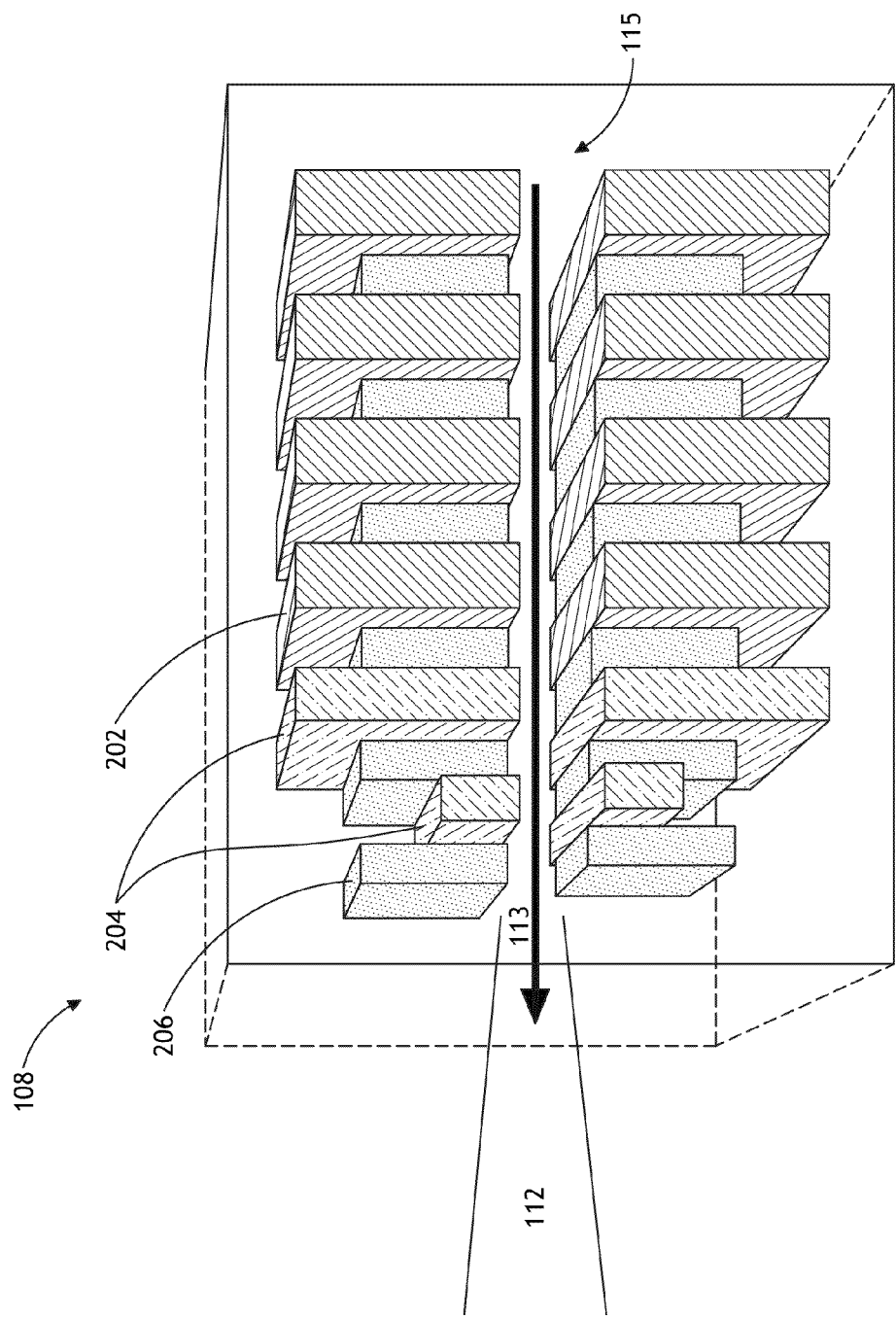
FIG. 2 is a schematic view of a multipole wiggler insertion device, in accordance with one embodiment of the present invention.

FIG. 2 illustrates a schematic view of a wiggler insertion device 108, in accordance with one embodiment of the present invention. In one embodiment, the one or more wiggler insertion devices 108 of the radiation source 100 include a plurality of magnetic poles suitable for generating a periodic alternating magnetic field for producing synchrotron radiation 112 emitted along the direction of travel 113 of the electrons. The one or more wiggler insertion devices 108 generate synchrotron radiation 112 along the direction of travel by accelerating the electrons passing through the gap 115 (e.g., gap between top portion and bottom portion of wiggler insertion device 108) of a given wiggler insertion device 108 periodically along a direction perpendicular to the direction of travel.

In one embodiment, the one or more wiggler insertion devices 108 include a set of main poles 202 and a set of soft magnet poles 206. In a further embodiment, each of the set of soft magnets 206 is interleaved between each adjacent pair of main poles 202. In another embodiment, the main poles 202 are formed from any permanent magnetic material known in the art. In another embodiment, the soft magnet poles 206 may be formed from any soft magnetic material known in the art. For example, the soft magnets 206 may include a cobalt-iron based magnetic alloy, such as, but not limited to, PERMENDUR. In a further embodiment, the one or more wiggler insertion devices 108 include a set of end poles 204. In another embodiment, the set of end poles 204 may be formed from a permanent magnetic material.

It is noted herein that the compact feature of the synchrotron radiation source 100 of the present invention is partially enabled via compact wiggler design and/or compact electron storage ring design. In one embodiment, in the case of a permanent magnet (PM) based wiggler insertion device, the size of the PM wiggler insertion device may be manufactured to have a length of approximately 1 to 3 m. It is further recognized that the size required for superconducting magnet (SM) wiggler insertion devices suitable for implementation in the present invention may be shorter than PM based wiggler insertion devices.

In another embodiment, the compact design of the synchrotron source 100 of the present invention is enabled by various design features of the electron storage ring 101. In one embodiment, the storage ring 101 of synchrotron source 100 may be configured to generate an electron beam having a "low" energy substantially between 100 and 600 MeV and modest current between approximately 100-900 mA. It is noted herein that the choice of low energy for the electron storage ring design allow for a compact electron ring 101 and accelerator 107. In another embodiment, a bending radius of approximately 0.5 may allow for a compact design of the storage ring 101.

In another embodiment, wiggler synchrotron source 100 may include a set of adaptive electron optics 109a, 109b configured to manipulate one or more spatial characteristics of the electron beam as it passes through the one or more wiggle insertion devices 108. It is noted herein that the etendue of the light 112 outputted from the one or more wiggler devices is a function of the spatial extent of the electron beam (as it passes through the one or more wiggler insertion device 108) and the angular extent of the photon beam caused by the operation of the one or more wiggler insertion devices 108 on the electron beam. As such, the etendue of the light beam 112 may be controlled by manipulating the spatial extent of the electron beam.

In a further embodiment, the set of adaptive electron optics 109a, 109b are configured to match the etendue of the light beam 112 emitted by the one or more wiggler insertion devices 108 to the optical input of an associated optical characterization system by adjusting the spatial extent of the electron beam of the electron storage ring 101 within the one or more wiggler insertion devices. The adaptive electron optics 109a and 109b are described in additional detail further herein.

Figure 3A:
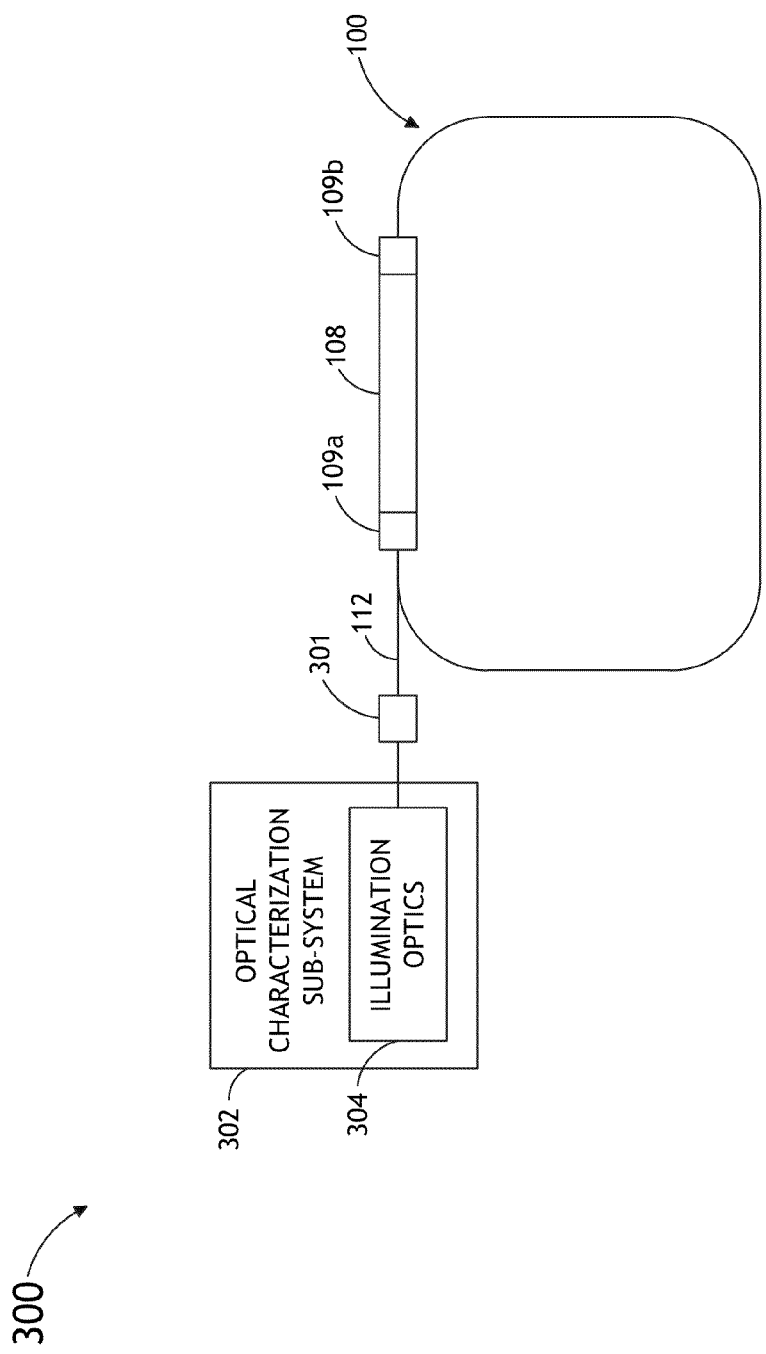
FIG. 3A is a block diagram view of an optical characterization system equipped with a wiggler synchrotron radiation source, in accordance with one embodiment of the present invention.

FIG. 3A illustrates a simplified block diagram view of a wafer/mask inspection or metrology system 300 equipped with a wiggler synchrotron source 100. It is again noted that wiggler synchrotron source 100 described throughout the present disclosure may be implemented in conjunction with any wafer or mask inspection or metrology optical architecture known in the art. For example, as shown in FIG. 3A, system 300 may include the wiggler synchrotron source 100, a set of beam delivery optics 301, and a mask/wafer characterization optical sub-system 302.

In one embodiment, the adaptive electron optics 109a, 109b may match the etendue of the light beam 112 to the set of illumination optics 304 of the optical characterization system 300 by adjusting one or more spatial characteristics of the electron beam of the electron storage ring 101. In another embodiment, the set of adaptive electron optics 109a, 109b may match the etendue of the emitted light beam 112 to the illumination optics 304 of inspection system 300 by increasing the etendue of the light beam 112. In a further embodiment, the set of adaptive electron beam optics 109a, 109b may increase the etendue of the light beam 112 by enlarging the spatial extent of the electron beam as it passes through the one or more wiggler insertion devices 108.

In another embodiment, the adaptive electron optics 109a and 109b may be disposed at both ends of the one or more wiggler insertion devices 108. In a further embodiment, the adaptive electron optics may include a set of entrance optics 109a and exit optics 109b positioned before and after the one or more wiggler insertion devices 108 respectively. It is again noted herein that enlargement of the spatial extent of the electron beam as the electrons pass through the one or more wiggler insertion devices may cause an increase in the etendue of the light beam 112 emitted by the one or more wiggler insertion devices 108. In this regard, the spatial extent of the electron beam can be enlarged by the entrance optics 109a such that the etendue of the light beam 112 emitted by the one or more wiggler devices 108 matches an input of the one or more illumination optics 304 of the optical characterization sub-system 302. In turn, the one or more exit electron optic devices 109b may collapse the spatial extent of the electron beam upon exiting the one or more wiggler devices 108. In one embodiment, the one or more exit electron optic devices 109b may collapse the spatial extent of the exiting electron beam such that it has a stable orbit in the electron storage ring. In another embodiment, the one or more exit electron optic devices 109b may collapse the spatial extent of the exiting electron beam such that it has a spatial extent substantially similar to the electron beam prior to entrance into the one or more wiggler insertion devices 109. It is noted herein that it is not a requirement of the present invention that the exiting spatial extent of the electron beam is substantially matched to the spatial extent of the entrance spatial extent.

In another embodiment, light from a wiggler 108 of the wiggler synchrotron source 100 is delivered to the optical input of the optical sub-system of the wafer/mask characterization system 300. For example, light from a wiggler 108 of the wiggler synchrotron source 100 may be delivered to the optical input of a set of illumination optics 304 of the optical sub-system of the wafer/mask characterization system 300. In a further embodiment, the light from wiggler 108 is delivered to the set of illumination optics 304 via a set of beam delivery optics 301. In another embodiment, the beam delivery optics 301 may include any beam delivery optics known in the art. For example, the beam delivery optics 301 may include, but are not limited to, beam steering optics (e.g., mirrors, beam splitters, lenses and the like) configured to direct illumination 112 from the wiggler 108 of the synchrotron source 100 to the illumination optics 304 of system 300. For instance, the beam steering optics of the beam delivery optics 301 may include a set of relay mirrors suitable for directing light from the synchrotron source 100 to the illumination optics 304. By way of another example, the beam delivery optics may include, but are not limited to, spectral filtering optics and one or more diffraction gratings configured to transmit or direct selected wavelength bands of the illumination 112 from the wiggler 108 to the illumination optics of system 300.

The wiggler synchrotron source 100 may act as an illumination source of an optical characterization system 300. The optical characterization system may include, but is not limited to, an actinic EUV mask inspection system, wafer inspection and a EUV mask metrology system, such as an actinic mask review system or a EUV mask reflectometry system.

Figure 3B:
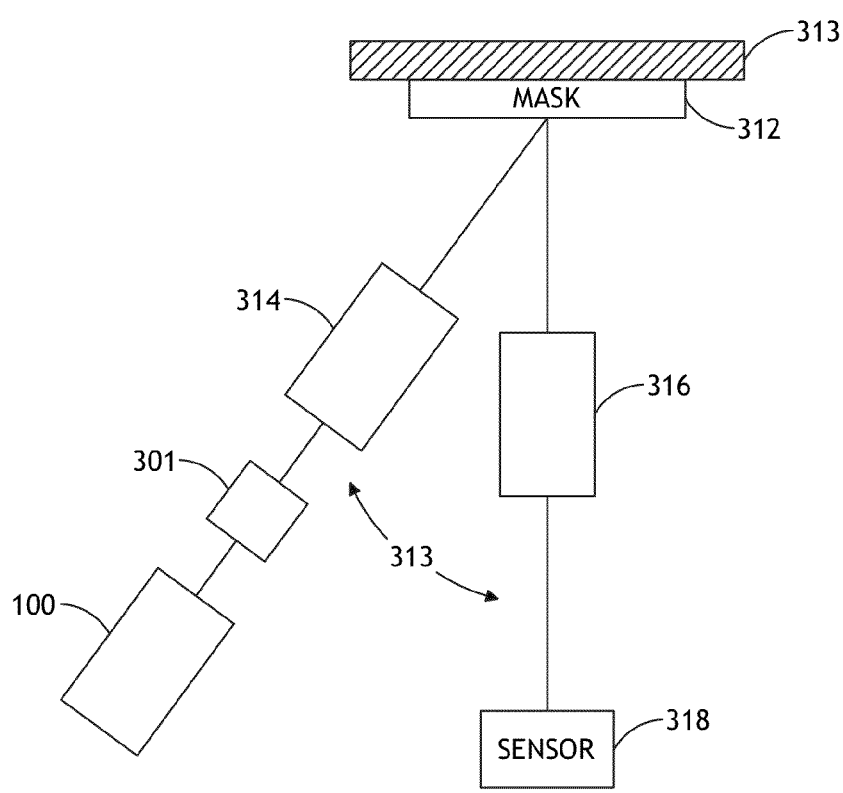
FIG. 3B is a block diagram view of an actinic EUV mask inspection system equipped with a wiggler synchrotron radiation source, in accordance with one embodiment of the present invention.

FIG. 3B illustrates a block diagram view of an actinic EUV mask inspection system 310 equipped with the wiggler synchrotron radiation source 100 described throughout the present disclosure. It is noted herein that the description of the various components of system 300 should be interpreted to extend to system 310. In one embodiment, light from the wiggler synchrotron source 100 is delivered to an optical sub-system 313 of the actinic EUV mask inspection system 310. The optical sub-system 313 may include, but is not limited to, illumination optics 314, objective optics 316 and sensor 318. In this regard, light from the wiggler synchrotron source 100 is delivered to a set the illumination optics 314 of the mask inspection system 310 via beam delivery optics 301 (e.g., beam steering optics, relay mirrors, spectral filtering optics, diffraction grating and the like). In one embodiment, due to the narrowband requirements of an actinic EUV mask inspection system (or actinic mask review system), spectral filtering optics or a diffraction grating of the beam delivery optics 301 may be used to selectively filter broadband illumination from the wiggler 108 of source 100 such that only a selected wavelength band (e.g., 13.5 nm EUV) is provided to the illumination optics 314 of the mask inspection system 310.

In a further embodiment, spectral filtering optics or a diffraction grating of the beam delivery optics 301 may be used to select the centroid wavelength for transmission to the illumination optics 314 of the inspection system (or review system). It is noted herein that use of the centroid wavelength in the inspection (or review) process carried out by system 310 may lead to improved accuracy of defect printability estimation. In one aspect, careful choice of the inspection or review wavelength for image acquisition, coupled with a computational model for "wafer-plane" review, may lead to simpler and more accurate estimates of defect printing. In another aspect, tuning the illumination used in the inspection (or review) process over a wider range, but within the spectral bandwidth of the multilayered surfaces of components of optical sub-system 313, coupled with photon and electron detectors or spectrometers, provide additional information (e.g., composition information) to the defect classification process.

In another embodiment, the illumination optics 314 may direct the illumination from the delivery optics 301 to a mask 312 disposed on a mask stage 313. In one embodiment, the mask 312 may include, but is not limited to, a reflective mask. For instance, the mask 312 may include a reflective mask having a patterned absorbing layer disposed on a resonantly-reflective substrate (e.g., Mo—Si multilayer).

It is noted herein that the illumination optics 314 of the actinic EUV mask inspection system 310 may include any optical components suitable for use in a set of EUV illumination optics. For instance, the illumination optics may include, but are not limited to, EUV mirrors (e.g., multilayer mirrors for reflection of EUV light (e.g., 13.5 nm light)) suitable for directing the illumination from the beam delivery optics 301 to the mask. In another embodiment, light reflected from one or more regions of the mask 312 is collected by the objective optics 316. The objective optics 316 may then project an image of the one or more illuminated portions of mask 112 to a sensor 318. In another embodiment, the objective optics 316 of system 310 may include any optical components suitable for use in a set of EUV projection optics. For instance, the projection optics may include, but are not limited to, a series of EUV mirrors suitable for projecting the image of one or more portions of the mask 312 onto an imaging region of sensor 318. In another embodiment, sensor 318 may include any EUV-sensitive sensor known in the art. For example, the sensor 318 may include, but is not limited to, a CCD sensor. By way of another example, the sensor 318 may include, but is not limited to, a TDI-enabled CCD sensor (e.g., TDI-enabled silicon CCD sensor). It is noted herein that the presence of a defect in or on the mask 312 will cause a change in the reflection or scattering of photons by the mask, thereby altering one or more portions of the image acquired by sensor 318. It is further noted that the sensitivity of the actinic EUV mask inspection process is linked to the number of photons interacting with the given defect, through the statistical fluctuations in the recorded photons per image pixel (i.e., the shot noise effect). As such, it is desirable to utilize high brightness illumination sources in inspection systems, such as the actinic EUV mask inspection system 310.

In another embodiment, the system 310 may include one or more computational systems (not shown) communicatively coupled to the sensor 318. For example, the one or more computational systems may include one or more computer processors, a memory for storing data and program instructions for directing the one or more processors to carry out the various data processing steps described throughout the present disclosure. In this regard, the one or more processors of the computation system may receive one or more signals from sensor 318 indicative of inspection data received by sensor 318. In turn, the computation system may execute one or more processing and analysis routines to process and analyze the detected data for mask inspection (e.g., pattern inspection or defect detection).

In one embodiment, the etendue of the photon beam emitted by the multipole wiggler 108 of the synchrotron source 100 may be controlled in any manner known in the art. In a further embodiment, the system 310 may match the etendue of the light beam emitted by the wiggler 108 of the wiggler synchrotron source 100 with an optical input, such as the set of illumination optics 314, of the mask inspection system 310. It is recognized herein that etendue matching in the actinic EUV mask inspection system 310 of the present invention may aid in maximizing source utilization, while reducing the technical demands on the synchrotron source 100.

In one embodiment, the etendue of the light beam 112 from the wiggler 108 of the synchrotron source 100 may be controlled by manipulating the spatial characteristics of the electron beam of the source 100. In this regard, the phase space distribution of the electron beam in the storage ring 101 may be manipulated to control the etendue of the EUV light beam emitted by the synchrotron source 100. Phase space distribution manipulation provides a flexible and lossless way to fill the illumination pupil of the illumination optics 314 of the optical sub-system 313. In this regard, the etendue of the photon beam entering the illumination optics 314 of the inspection system 310 may be set at a selected level through the choice of the focusing magnet design in the storage ring 101. For instance, the etendue of the photon beam entering the illumination optics 314 of the inspection system 310 may be set at a level required by the given inspection system architecture through the choice of the focusing magnet design in the storage ring 101. It is noted herein that this ability results from the fact that the angular distribution (e.g., on the order of 1 mrad) of the photon beam 112 emitted by the wiggler 108 is created by the periodic excursions of the electron beam passing through the wiggler 108. It is further noted that the periodic excursions of the wiggler beam are much larger than the divergence angle of the electron beam (e.g., on the order of 1 μrad).

It is recognized herein that the etendue of the wiggler synchrotron source 100 may be matched to the illumination optics 314 of the optical sub-system 313 of the inspection system 310 in any manner known in the art.

As previously described, the wiggler synchrotron source 100 of the actinic EUV mask inspection system 310 may include the set of adaptive electron optics 109a, 109b configured to match the etendue of the light beam 112 emitted by the one or more wiggler insertion devices 108 to the optical input (e.g., set of illumination optics 314) of the actinic EUV mask inspection system 310. Again, the adaptive electron optics 109a, 109b may match the etendue of the light beam 112 to the set of illumination optics 314 of the actinic EUV mask inspection system 310 by adjusting one or more spatial characteristics of the electron beam of the electron storage ring 101. For example, the set of adaptive electron beam optics 109a, 109b may increase the etendue of the light beam 112 (in order to match input requirements of inspection system 310) by enlarging the spatial extent of the electron beam as it passes through the one or more wiggler insertion devices 108.

In one embodiment, the entrance optics 109a and exit optics 109b of the adaptive electron optics may include, but are not limited to, a set of skew quadrupole magnets positioned before and after the one or more wiggler insertion devices 108 respectively. In this regard, the skew quadrupole magnets are suitable for generating an electron beam having a size sufficient to generate a light output 112 that matches the requirements of the optical sub-system 313 of the inspection system 310. In another embodiment, the adaptive electron optics may include, but are not limited to, a set of electromagnet beam modulating devices positioned before and after one or more wiggler insertion devices 108. In this regard, the set of electromagnet beam modulating devices are configured to steer the electron beam in high frequency such that the averaged (within detector response time) beam spatial characteristics is sufficient to generate a light output 112 that matches the requirements of the optical sub-system 313 of the inspection system 310. It is noted herein that since the etendue of the light beam 112 is controlled by the convolution of the synchrotron emission distribution from a single electron with the electron beam spatial and angular distribution within the insertion device, the required light etendue is achieved without disrupting the "natural" electron beam emittance.

In another embodiment, under equilibrium, or "natural" conditions of electron beam emittance, the design of a magnet "lattice" of the synchrotron source 100 may provide the required etendue of light emitted by the wiggler insertion device 108. The use of a magnet lattice in a synchrotron source to control etendue is described in David Attwood, *Soft X-Rays and Extreme Ultraviolet Radiation*, 1st ed, Cambridge University Press, 1999, pp. 172-188, which is incorporated herein by reference in the entirety.

In another embodiment, the etendue of the light beam from the wiggler 108 of the synchrotron source 100 may be controlled via spectral dispersion of the light emitted by the wiggler insertion device 108. The bandwidth required (e.g., 1-2%) by an actinic EUV mask inspection system may be selected from the broadband output of wiggler 108 via first-order diffraction from a diffraction grating. In another embodiment, for a given bandwidth, the angular dispersion of the diffraction grating (not shown) is matched to the entrance aperture for the illumination optics 314.

In another embodiment, the power required for the inspection system 310 is given by the product of the required brightness of the system 310 and the etendue of the system 310. In turn, the etendue of the system 310 consists of the product of the acceptance solid angle and the illumination area of system 310. In the context of actinic EUV mask inspection, a given mask is generally raster-scanned with only a small region of the given mask being illuminated at a given time. The etendue of an actinic EUV mask inspection system is typically small, leading to simultaneous modest average power and high brightness of the inspection system. For example, to support a high throughput of 1 hour/mask, while utilizing only a few TDI-CCD based sensors, the illumination source of a typical actinic EUV mask inspection system should have a brightness of approximately 100 to 1000 W/(mm$^2$-Sr). In comparison, a Xe-based discharge-produced-plasma (DPP) source may have an available brightness of about 5 W/(mm²-Sr), while a Xe-based Laser-produced-plasma (LPP) source may have an available brightness of approximately 25 W/(mm²-Sr). However, the average power requirement of a typical actinic EUV mask inspection system is approximately 0.2 to 2 W, resulting from the small etendue (e.g., 1 to 4×10⁻³ mm²) required by a typical actinic EUV mask inspection system.

It is noted herein that the etendue of a typical actinic EUV mask inspection system is generally orders of magnitude higher than that of a typical synchrotron radiation light beam. It is further noted that the etendue of a synchrotron radiation source is produced by the convolution of electron beam emittance (which can be tailored over a wide range) and the synchrotron emission (which has small angular distribution). As such, the design of the compact synchrotron source 100 of the present invention may be optimized (or at least improved to a sufficient level) for actinic EUV mask inspection (as well as broadband wafer inspection) through the design of the electron optics of the electron storage ring 100 and the wiggler insertion device 108.

It is further noted herein that the multipole wiggler insertion device 108 of the present invention allows for generation of EUV light in all periods. As such, the multipole wiggler insertion device 108 provides a direct path to increase broadband power in a given optical characterization system (e.g., actinic EUV mask inspection system or wafer inspection system) The in-band EUV power (in watts) for actinic EUV mask inspection (e.g., 2.5% bandwidth at 13.5 nm) from a wiggler insertion device is given by:

$$P = (0.14) L \cdot B \cdot I \cdot G1\left(\frac{E}{E_C}\right)$$

Where L is the total wiggler length (m) and given by L=NLw, where N is the total number of periods and Lw is the size of wiggler period (m). In addition, B is the peak magnetic field in the wiggler (T), I is the beam current (A) and G1 is an energy dependence factor in which E is the photon energy (e.g., for 13.5 nm light the energy is 92 eV) and $E_c$ represents the critical energy, given by Ec=(665 eV) $E_e^2 \cdot B$, where $E_e$ is the electron beam energy (in GeV). The wiggler insertion devices are described in David Attwood, *Soft X-Rays and Extreme Ultraviolet Radiation*, 1st ed, Cambridge University Press, 1999, pp. 172-188, which has been incorporated by reference above in the entirety.

Further, in settings where the energy of the storage ring 101 is chosen for peak output for actinic EUV mask inspection purposes, significant broadband output at longer wavelengths (e.g., 100-200 nm) suitable for wafer inspection is also produced.

In one embodiment, a compact low-energy wiggler synchrotron source 100, as described throughout the present disclosure, may possess the following parameters: $E_e$=270 MeV, B=2T (permanent magnet level), L=1 m, N=6, Lw=16 cm, I=200 mA. Based on the equation provided above, such a set of parameters may produce EUV in-band power at 0.4 W, which is adequate for current actinic EUV mask inspection needs. Applicant notes that the listed synchrotron source parameters are provided merely for illustrative purposes and should not be interpreted as limitations on the present invention.

In one embodiment, a compact low-energy wiggler synchrotron source having characteristics as listed above may have beam divergence angles such as 1.9 (v)×101(h) mrad. In the case of actinic EUV mask inspection, etendue requirements may require beam sizes of approximately 4400(v)×100 (h) μm. Applicant notes that such a beam is generally large by typical synchrotron standards. Such a configuration allows collection of increased current due to the effective elimination of the etendue limit on the electron gun, thereby leading to reduced storage ring fill times.

It is noted herein that the total radiated power of the wiggler 108 when integrated over all frequencies may be on the order of 10-100 W. It is further recognized herein that the power inputted into the illumination optics 314 of the actinic EUV mask inspection system 310 may be regulated utilizing various filtering methods. For example, an absorber incorporated into the beam delivery optics 301 may be used to regulate power inputted into the illumination optics 314. By way of another example, a diffraction grating may be used to regulate power inputted into the illumination optics 314.

In another embodiment, the inspection system 310 may include an undulator (not shown) disposed in the pathway of the electron storage ring 101 of the synchrotron source 100. It is noted herein that in narrow-band systems (e.g., actinic EUV mask inspection system or actinic mask review system), where out-of-band radiation is of concern, an undulator may be utilized within the storage ring 101 of the synchrotron source 100. The utilization of an undulator within the storage ring 101 may provide improved radiation properties. For example, the use of an undulator may provide cleaner and tunable radiation centered at a desired wavelength emitted by the source 100.

In another embodiment, the light 112 emitted by the wiggler insertion device 108 is linearly polarized. It is noted herein that the Brewster angle for EUV light (e.g., λ=13.5 nm) is close to 45°. As such, for an unpolarized beam incident at 45° on a turning mirror, p-polarized light within the incident beam is absorbed. As a result, the angles of incident of the light on multilayer-coated mirrors are restricted to small values (i.e., "normal incidence" mirrors). In one embodiment, these losses can be avoided for large angles of incidence by restricting beam turning to a single plane and orienting the wiggler field such that it provides an s-polarized output.

While the present disclosure has focused on the integration of the wiggler synchrotron radiation source 100 in an actinic EUV mask inspection system (e.g., system 310), it is noted herein that the embodiments, processes and principles described may be extended to various other wafer/mask optical characterization systems. In one embodiment, the wiggler synchrotron radiation source 100 may be implemented in the context of a broadband wafer inspection system (e.g., wafer inspection system 320). In another embodiment, the wiggler synchrotron radiation source 100 may be implemented in the context of a narrowband metrology system, such as an actinic mask review system (now shown) and a EUV mask reflectometry system (e.g., reflectometry system 330).

Figure 3C:
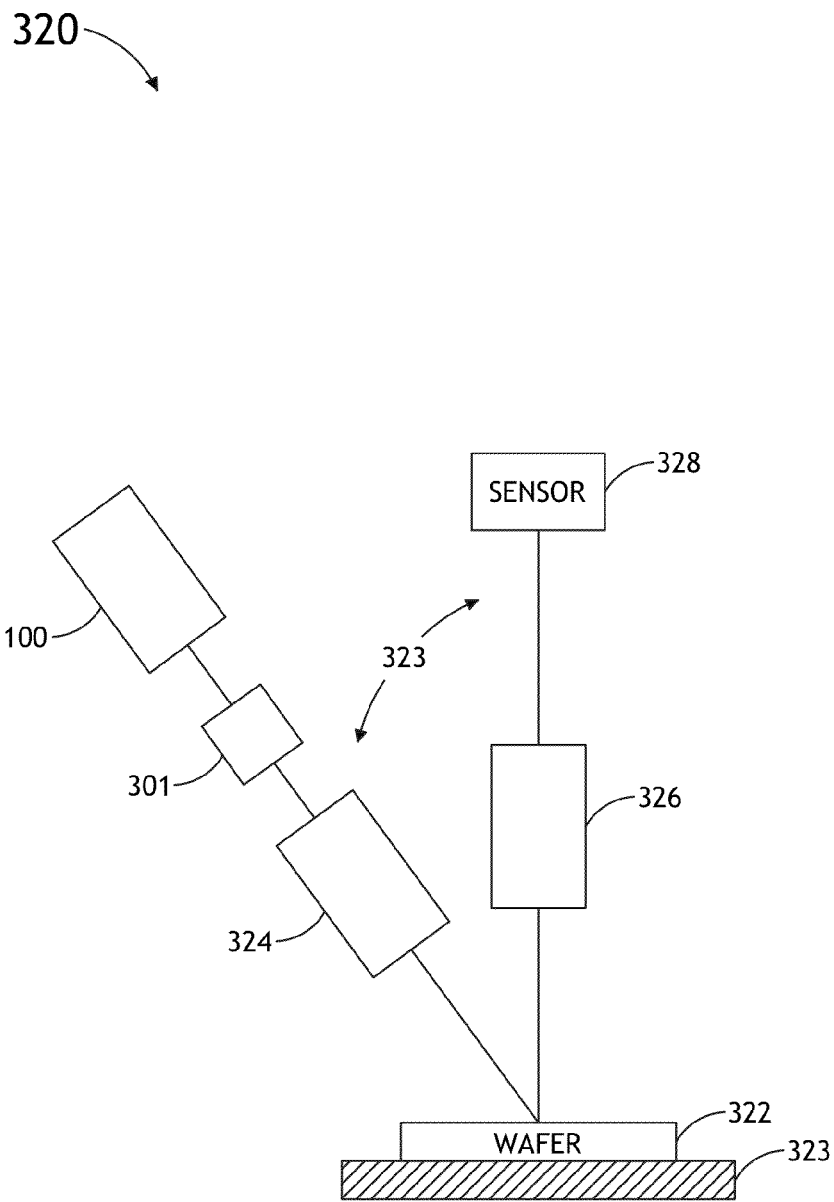
FIG. 3C is a block diagram view of a wafer inspection system equipped with a wiggler synchrotron radiation source, in accordance with one embodiment of the present invention.

FIG. 3C illustrates a block diagram view of a wafer inspection system 320 suitable for implementing the wiggler based synchrotron radiation source described previously herein. In one embodiment, light from the wiggler synchrotron source 100 is delivered to an optical sub-system 323 of the wafer inspection system 320. The optical sub-system 323 may include, but is not limited to, illumination optics 324, objective optics 326 and sensor 328. In this regard, light from the wiggler synchrotron source 100 is delivered to an optical input, such as the set the illumination optics 324, of the wafer inspection system 320 via beam delivery optics 301, such as beam steering optics, relay mirrors and filtering optics (e.g., spectral filtering optics, diffraction grating and the like). It is noted herein that the description of the various components of systems 300 and 310 should be interpreted to extend to system 320.

It is further noted herein that the particular arrangement of optical components of system 320 depicted in FIG. 3C is not limiting and is provided merely for illustrative purposes. Rather, it is noted herein that the present invention may extend to any wafer inspection system architecture known in the art, such as a darkfield wafer inspection system or a brightfield wafer inspection system.

Figure 3D:
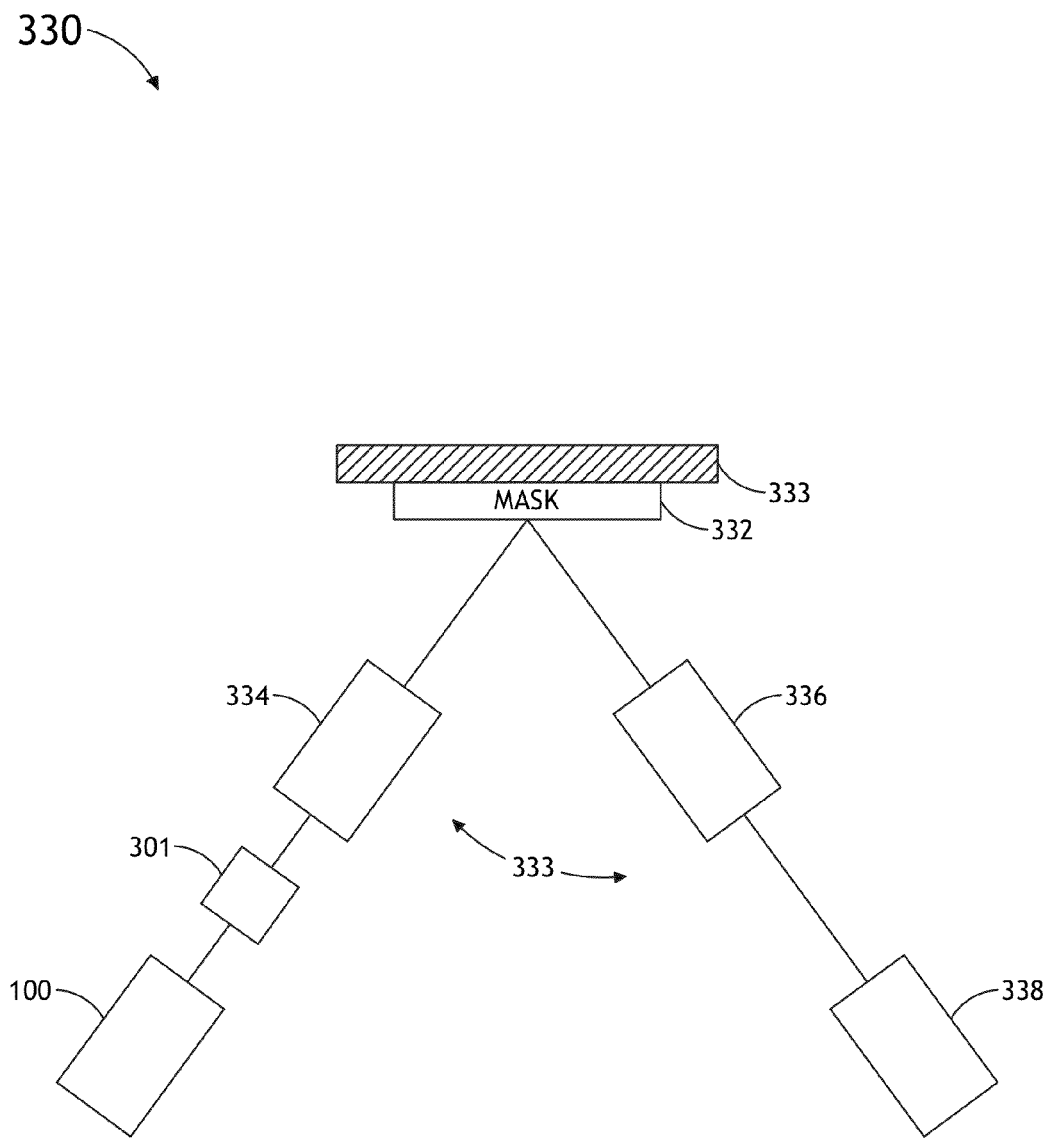
FIG. 3D is a block diagram view of a EUV mask reflectometry system equipped with a wiggler synchrotron radiation source, in accordance with one embodiment of the present invention.

FIG. 3D illustrates a block diagram view of a reflectometer-type mask metrology system 330 suitable for implementing the wiggler based synchrotron radiation source described previously herein. In one embodiment, light from the wiggler synchrotron source 100 is delivered to an optical sub-system 333 of the mask reflectometry system 320. The optical sub-system 333 may include, but is not limited to, illumination optics 334, objective optics 336 and sensor 338. In this regard, light from the wiggler synchrotron source 100 is delivered to an optical input, such as the set the illumination optics 334, of the mask reflectometry system 330 via beam delivery optics 301, such as beam steering optics, relay mirrors and filtering optics (e.g., spectral filtering optics, diffraction grating and the like). In one embodiment, due to the narrowband requirements of the mask reflectometry system 330, spectral filtering optics or a diffraction grating of the beam delivery optics 301 may be used to selectively filter broadband illumination from the wiggler 108 of source 100 such that only a selected wavelength band (e.g., 13.5 nm EUV) is provided to the illumination optics 334 of the mask reflectometry system. It is noted herein that the description of the various components of systems 300-320 should be interpreted to extend to system 330.

It is further noted herein that the particular arrangement of optical components of system 330 depicted in FIG. 3D is not limiting and is provided merely for illustrative purposes. Rather, it is noted herein that the present invention may extend to any mask metrology system architecture known in the art, such as an actinic mask review system, a EUV-based reflectometer system and the like.

Figure 4A:
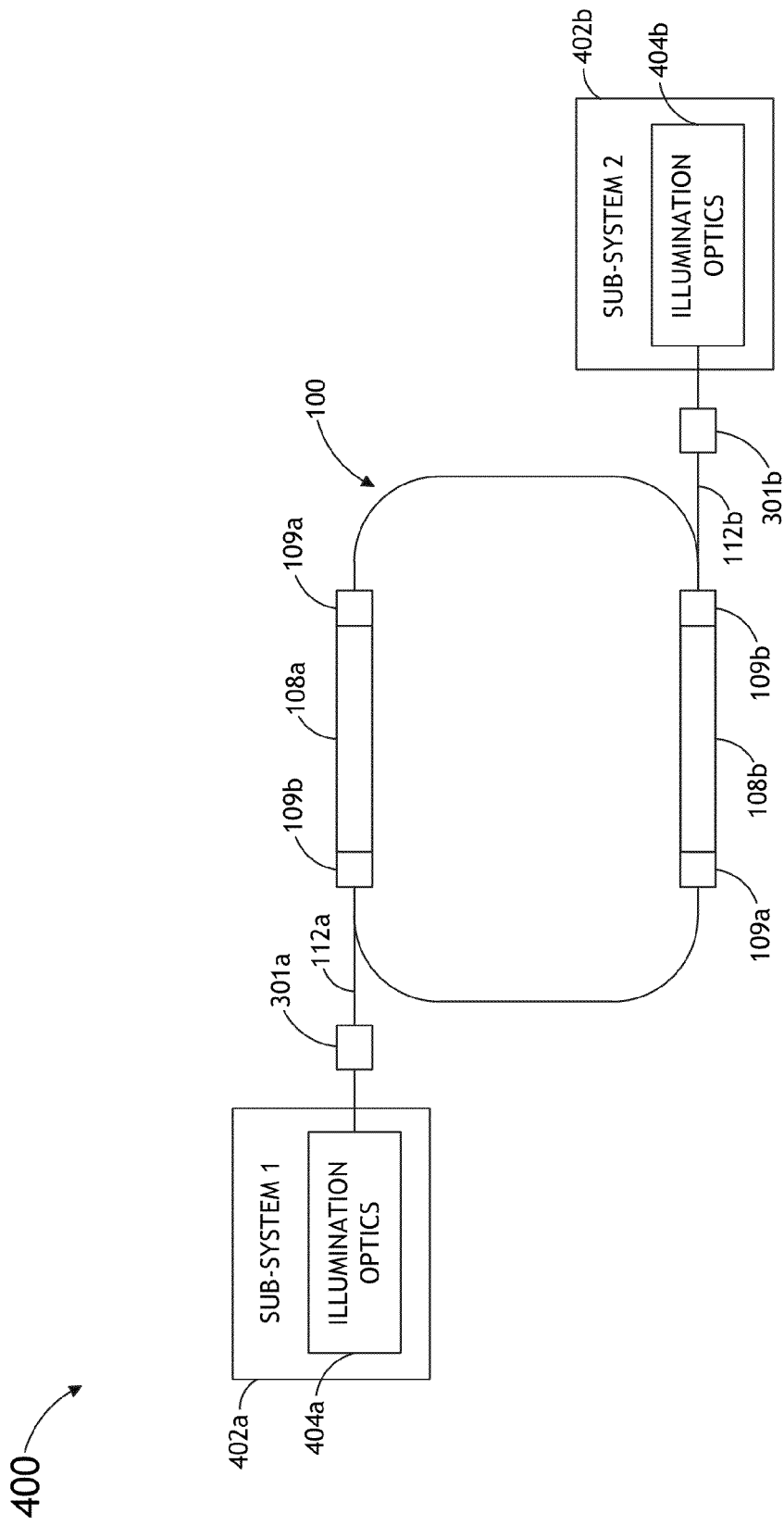
FIG. 4A is a block diagram view of a multiple sub-system optical characterization system equipped with multiple wiggler synchrotron radiation sources, in accordance with one embodiment of the present invention.

FIG. 4A illustrates a block diagram view of a system 400 including multiple optical characterization systems optically coupled to a single compact wiggler based synchrotron source 100, in accordance with one embodiment of the present invention. It is noted herein that joint optimization (or improvement) of the optical sub-system geometry, wiggler insertion device geometry and synchrotron source layouts, multiple optical characterization sub-assemblies may be optically coupled to a single synchrotron radiation source 100, as shown in FIG. 4A. Further, the compact design of the one or more wiggler insertion devices 108 and the electron storage ring 101, as discussed previously herein, enables compact design of the synchrotron radiation source 100. This compact radiation source design 100, in turn, allows for the coupling of multiple photon beam outputs of a single electron storage ring 101 to multiple optical characterization sub-systems. In one embodiment, the multi-system architecture 400 includes a first optical characterization sub-system 402a including a first set of illumination optics 404a and a second sub-system 402b including a second set of illumination optics. In a further embodiment, the synchrotron radiation source 100 may include a first wiggler insertion device 108a and a second wiggler insertion device 108b. In this regard, light 112a emitted by the first wiggler insertion device 108a may be directed by a first set of beam delivery optics (e.g., steering optics, relay optics, filter elements and the like) to the illumination optics 404a of optical characterization sub-system 402a. Likewise, light 112b emitted by the second wiggler insertion device 108b may be directed by a second set of beam delivery optics to the illumination optics 404b of optical characterization sub-system 402b.

In a further embodiment, the first and second optical characterization systems 402a, 402b may include any optical characterization sub-system described previously herein, such as an actinic EUV mask inspection sub-system, a wafer inspection sub-system or a EUV mask metrology system (e.g., actinic mask review system or EUV mask reflectometer). In another embodiment, the illumination optics 404a, 404b may include any set of illumination optics described previously herein suitable for receiving light from the beam delivery optics 301a, 301b respectively to a mask or wafer. It is noted herein that the description of the various components of systems 300-330 should be interpreted to extend to system 400.

While FIG. 4A depicts only two optical characterization sub-systems 402a, 402b coupled to a single synchrotron radiation source 100, it is noted herein that additional optical characterization sub-systems (e.g., a $3^{rd}$ optical characterization sub-system, a $4^{th}$ optical characterization system and so on) may be coupled to the single synchrotron radiation source 100. In one embodiment, the synchrotron radiation source 100 may include a separate wiggler insertion device 108 for each optical characterization sub-system.

Figure 4B:
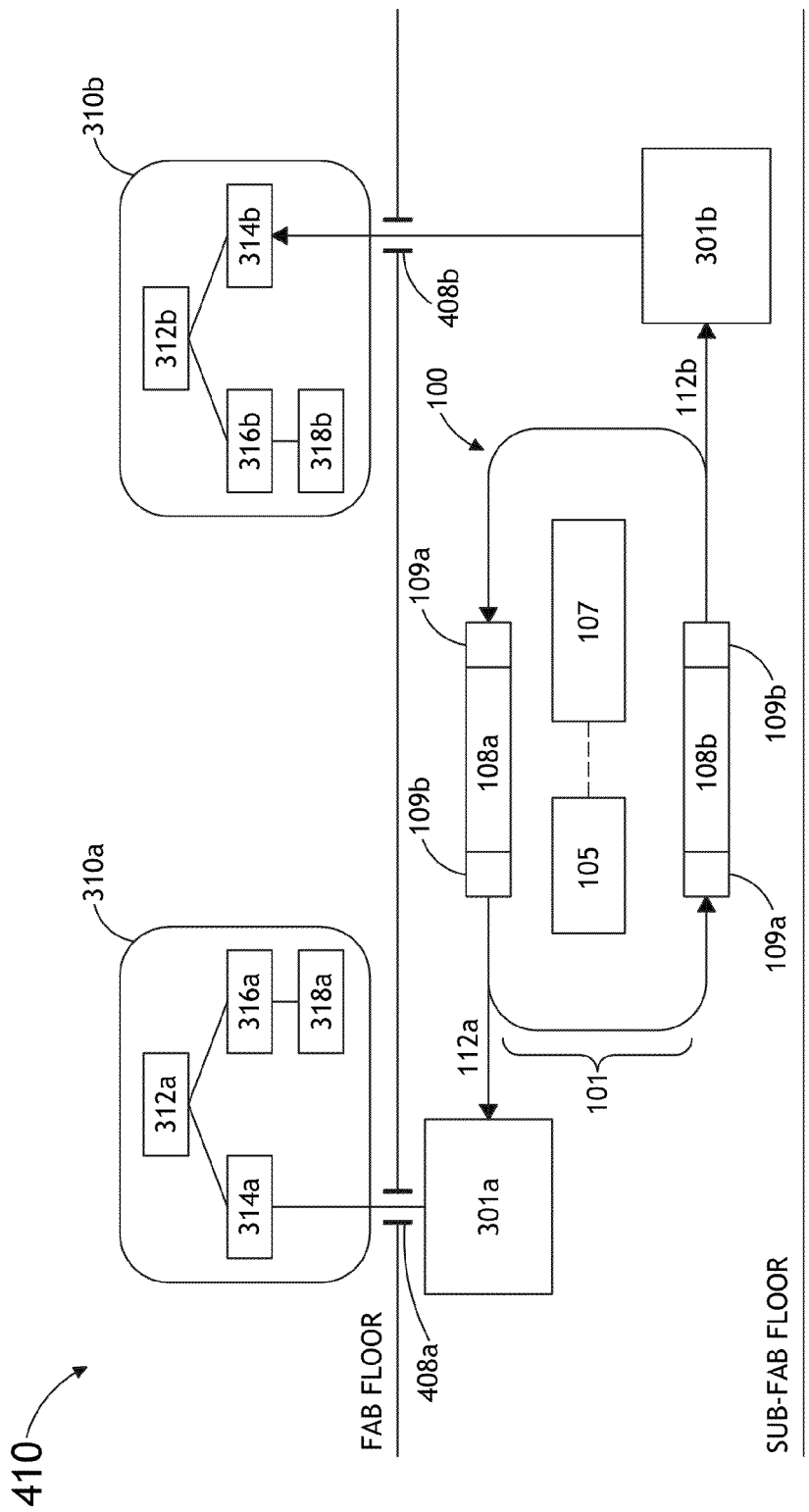
FIG. 4B is a block diagram view of a multiple sub-system actinic EUV mask inspection system equipped with multiple wiggler synchrotron radiation sources, in accordance with one embodiment of the present invention.

FIG. 4B illustrates a block diagram view of a system 410 including multiple actinic EUV mask inspection sub-systems 310a, 310b optically coupled to a single wiggler based synchrotron source 100 with the electron storage ring 101 arranged below the multiple optical characterization systems, in accordance with one embodiment of the present invention. In this embodiment, the electron storage ring 101 of the synchrotron radiation source 100 may be arranged below the fab-floor in a sub-fab floor. In a further embodiment, beam delivery optics 301a, 301b may deliver light through passthroughs 408a, 408b to the illumination optics 314a, 314b of each actinic EUV mask inspection sub-system 310a, 310b. It is noted herein that the description of the various components of systems 300-330 should be interpreted to extend to system 320.

While the system 410 illustrates two actinic EUV mask inspection sub-systems 310a, 310b, it is noted herein that any number of inspection/metrology systems may be implemented within the context of system 410. In addition, the system 410 may implement any one of the various optical characterization sub-systems described throughout the present disclosure. Further, system 410 may simultaneously implement different types of optical characterization sub-systems. For instance, although not shown, a first sub-system may include a narrowband (e.g., narrowband achieved using spectral filtering) actinic EUV mask inspection sub-system, while a second sub-system may include a broadband wafer inspection sub-system.

Figure 5:
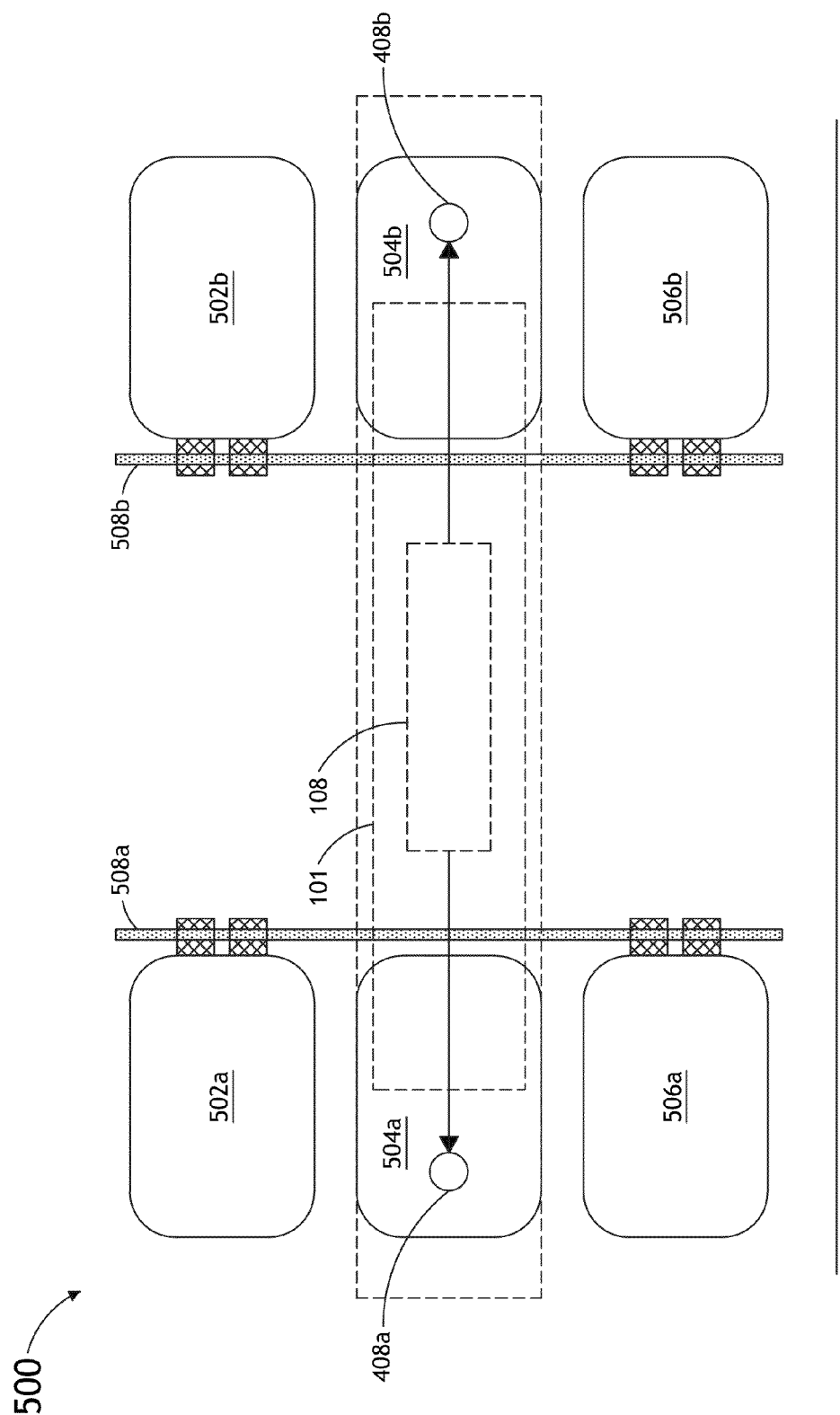
FIG. 5 is a block diagram view of a multiple sub-system optical characterization with the electron storage ring and the optical characterization sub-systems on different floors of the fabrication facility, in accordance with one embodiment of the present invention.

FIG. 5 illustrates a block diagram view of a system 500 including multiple optical characterization sub-systems 502a, 502b, 504a, 504b, 506a and 506b optically coupled to a single wiggler based synchrotron source 100 with the electron storage ring 101 arranged below the multiple optical characterization systems, in accordance with one embodiment of the present invention.

In one embodiment, the system 500 may include one or more fab overhead transport (OHT) systems 508a, 508b configured to selectively translate one or more of the optical characterization sub-systems 502a, 502b, 504a, 504b, 506a and 506b. In this regard, a controller (not shown) responsive to a pre-programmed set of program instructions and/or user input may direct one or more of the subsystems to move into alignment with one of the floor pass throughs 408a, 408b. For example, a given sub-system may be translated by a given OHT into a position above one of the pass throughs 408a, 408b. Once in position, the beam delivery optics 301a, 301b may optically couple the output of the wiggler insertion device 108 with the illumination optics of the given sub-system 502a, 502b, 504a, 504b, 506a and 506b. Then, once the inspection/metrology process is complete, the system 500 may move the measured sub-system out of position with respect to the pass throughs 408a, 408b and move a new sub-system into place. This process may be repeated as required. It is noted herein that the description of the various components of system 300-330, 400 and 410 should be interpreted to extend to system 500.

Those skilled in the art will recognize that it is common within the art to describe devices and/or processes in the fashion set forth herein, and thereafter use engineering practices to integrate such described devices and/or processes into data processing systems. That is, at least a portion of the devices and/or processes described herein can be integrated into a data processing system via a reasonable amount of experimentation. Those having skill in the art will recognize that a typical data processing system generally includes one or more of a system unit housing, a video display device, a memory such as volatile and non-volatile memory, processors such as microprocessors and digital signal processors, computational entities such as operating systems, drivers, graphical user interfaces, and applications programs, one or more interaction devices, such as a touch pad or screen, and/or control systems including feedback loops and control motors (e.g., feedback for sensing position and/or velocity; control motors for moving and/or adjusting components and/or quantities). A typical data processing system may be implemented utilizing any suitable commercially available components, such as those typically found in data computing/communication and/or network computing/communication systems.

The herein described subject matter sometimes illustrates different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected", or "coupled", to each other to achieve the desired functionality, and any two components capable of being so associated can also be viewed as being "couplable", to each other to achieve the desired functionality. Specific examples of couplable include but are not limited to physically mateable and/or physically interacting components and/or wirelessly interactable and/or wirelessly interacting components and/or logically interacting and/or logically interactable components.

While particular aspects of the present subject matter described herein have been shown and described, it will be apparent to those skilled in the art that, based upon the teachings herein, changes and modifications may be made without departing from the subject matter described herein and its broader aspects and, therefore, the appended claims are to encompass within their scope all such changes and modifications as are within the true spirit and scope of the subject matter described herein.

Although particular embodiments of this invention have been illustrated, it is apparent that various modifications and embodiments of the invention may be made by those skilled in the art without departing from the scope and spirit of the foregoing disclosure. Accordingly, the scope of the invention should be limited only by the claims appended hereto.

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes.

Furthermore, it is to be understood that the invention is defined by the appended claims.

What is claimed:

1. A method generating synchrotron radiation for an optical characterization system comprising:
   generating one or more beams of electrons;
   bending a trajectory of the electrons of the one or more electron beam to trace a closed path;
   generating a periodic alternating magnetic field suitable for producing synchrotron radiation emitted substantially along the direction of travel of the electrons by accelerating the electrons periodically in a direction perpendicular to the direction of travel with one or more wiggler insertion devices; and
   matching the etendue of a light beam emitted by the one or more wiggler insertion devices to an optical input of an optical characterization system.

2. The method claim 1, wherein the matching the etendue of a light beam emitted by the one or more wiggler insertion devices to an optical input of an optical characterization system comprises:
   matching the etendue of the light beam emitted by the one or more wiggler insertion devices to the optical input of the optical characterization system utilizing a set of adaptive electron optics.

3. The method of claim 1, wherein the matching the etendue of the light beam emitted by the one or more wiggler insertion devices to the optical input of the optical characterization system utilizing a set of adaptive electron optics comprises:
   matching the etendue of the light beam emitted by the one or more wiggler insertion devices to the optical input of the optical characterization system by adjusting one or more spatial characteristics of the electron beam of the electron storage ring.

4. The method of claim 3, wherein the matching the etendue of the light beam emitted by the one or more wiggler insertion devices to the optical input of the optical characterization system by adjusting one or more spatial characteristics of the electron beam of the electron storage ring comprises:
   enlarging the etendue of the light beam emitted by the one or more wiggler insertion devices to match the optical input of the optical characterization system by at least enlarging the spatial extent of the electron beam within the one or more wiggler insertion devices.

5. The method of claim 1, wherein the optical characterization system comprises:

at least one of a an actinic EUV mask inspection system, a wafer inspection system and a mask metrology system.

6. The method of claim 1, wherein the generating one or more beams of electrons comprises:
  generating one or more beams of electrons with an electron gun operably coupled to an electron accelerator device.

7. The method of claim 6, wherein the generating one or more beams of electrons with an electron gun operably coupled to an electron accelerator device comprises:
  generating one or more beams of electrons with an electron gun operably coupled to a compact microtron device.

8. The method of claim 6, wherein the generating one or more beams of electrons with an electron gun operably coupled to a compact microtron device comprises:
  generating one or more beams of electrons with an electron gun operably coupled to a linac device.

9. The method of claim 1, wherein the generating one or more beams of electrons comprises:
  generating one or more beams of electrons having an energy substantially between 100 and 600 MeV.

10. The method of claim 1, wherein the generating one or more beams of electrons comprises:
  generating one or more beams of electrons having an energy substantially between 200 and 900 MeV.

* * * * *